(12) United States Patent
Sethu et al.

(10) Patent No.: US 11,469,151 B2
(45) Date of Patent: Oct. 11, 2022

(54) RELATING TO PASSIVATION LAYERS

(71) Applicants: Raj Sekar Sethu, Sarawak (MY); Peng Yang, Sarawak (MY); Kumar Sambhawam, Sarawak (MY)

(72) Inventors: Raj Sekar Sethu, Sarawak (MY); Peng Yang, Sarawak (MY); Kumar Sambhawam, Sarawak (MY)

(73) Assignee: X-FAB SARAWAK SDN. BHD., Sarawak (MY)

( * ) Notice: Subject to any disclaimer, the term of this patent is extended or adjusted under 35 U.S.C. 154(b) by 56 days.

(21) Appl. No.: 16/587,836

(22) Filed: Sep. 30, 2019

(65) Prior Publication Data
US 2020/0111718 A1 Apr. 9, 2020

(30) Foreign Application Priority Data
Oct. 3, 2018 (GB) .................................. 1816134

(51) Int. Cl.
H01L 23/31 (2006.01)
H01L 23/29 (2006.01)
H01L 21/02 (2006.01)
H01L 21/3105 (2006.01)
H01L 21/768 (2006.01)

(52) U.S. Cl.
CPC .... H01L 23/3171 (2013.01); H01L 21/02164 (2013.01); H01L 21/02274 (2013.01); H01L 21/31053 (2013.01); H01L 21/7685 (2013.01); H01L 23/291 (2013.01)

(58) Field of Classification Search
None
See application file for complete search history.

(56) References Cited

U.S. PATENT DOCUMENTS

| 5,849,632 A | 12/1998 | Tuttle et al. |
| 6,001,735 A * | 12/1999 | Tsai ................... H01L 21/76807 257/587 |
| 6,165,886 A | 12/2000 | Lin et al. |
| 6,277,725 B1 | 8/2001 | Hsiao |
| 6,727,184 B1 * | 4/2004 | Wang ................ H01L 21/31055 438/712 |
| 7,632,755 B2 * | 12/2009 | Kim .................. H01L 21/76801 257/E21.252 |
| 8,860,224 B2 | 10/2014 | Chen et al. |

FOREIGN PATENT DOCUMENTS

| CN | 1399314 | 2/2003 |
| CN | 105336712 | 2/2016 |

(Continued)

OTHER PUBLICATIONS

GB, Combined Search and Examination Report under Sections 17 and 18(3); Patent Application No. GB1816134.9; 9 pages (dated Mar. 12, 2019).

(Continued)

Primary Examiner — Robert K Carpenter
(74) Attorney, Agent, or Firm — Thompson Hine LLP

(57) ABSTRACT

A semiconductor device includes a metal component covered by a passivation layer, wherein the metal component has a top surface and the passivation layer includes an outer layer which is substantially planar. The outer layer of the passivation layer does not extend below the top surface of the metal component.

11 Claims, 2 Drawing Sheets

(56) References Cited

FOREIGN PATENT DOCUMENTS

EP        0759635      2/1997
JP        H03131032    6/1991

OTHER PUBLICATIONS

Alpern, Peter et al.: "On the Way to Zero Defect of Plastic-Encapsulated Electronic Power Devices—Part III: Chip Coating, Passivation, and Design." IEEE Transactions on Device and Materials Reliability, vol. 9, No. 2, pp. 288-295 (Jun. 2009).

* cited by examiner

RELATING TO PASSIVATION LAYERS

This application claims priority to United Kingdom patent application no. 1816134.9 entitled IMPROVEMENTS RELATING TO PASSIVATION LAYERS and filed on Oct. 3, 2018, the entire contents of which are hereby incorporated by reference.

TECHNICAL FIELD

The invention relates to improvements in passivation layers for semiconductor devices, and generally to the field semiconductor wafer fabrication.

BACKGROUND

After devices have been fabricated on a silicon substrate (wafer), connections can be made to link the circuits together. This process is called metallization. Metal layers may be deposited on the wafer to form conductive pathways. The most common metals include aluminum, nickel, chromium, gold, germanium, copper, silver, titanium, tungsten, platinum, and tantalum. Selected metal alloys may also be used. Metallization is often accomplished with a vacuum deposition technique. The most common deposition processes include filament evaporation, electron-beam evaporation, flash evaporation, induction evaporation, and sputtering.

A passivation layer can be added to a semiconductor surface to provide electrical stability by isolating the semiconductor surface from electrical and chemical conditions in the environment, thus preventing the semiconductor surface from bonding with, and absorbing, contaminating atoms and molecules. Metal layers may be contained within a silicon dioxide layer, and passivation provided above this.

A problem is that cracks (passivation cracks) can arise in the passivation layer on a metal layer, and these cracks can be made worse during temperature cycling tests (TCTs). Standard passivation layers for thick metals (which may be known as METTHK) have the potential for cracks right after PECVD (Plasma Enhanced Chemical Vapor Deposition) silicon nitride, $Si_3N_4$, deposition.

Known methods of reducing passivation cracks encompassing thick metals (i.e. metal layers with a thickness greater than 3000 nm) include controlling the ratio of distance between the metal lines and the thickness of the top metallization (U.S. Pat. No. 8,860,224, Chen et al 2014, see below) and including numerous metal slots (U.S. Pat. No. 6,165,886, Lin et al 2000, see below), (Alpern et al 2009, see below). These prior solutions increase the design rules for thick top metals. Thus there is a need for a method of avoiding passivation cracks which is not limited to such design rules, and which allows designers to freely design thick top metal routing.

REFERENCES

Alpern, Peter, Peter Nelle, Endre Barti, Helmut Gunther, Angela Kessler, Rainer Tilgner, and Matthias Stecher. "On the way to zero defect of plastic-encapsulated electronic power devices—Part III: chip coating, passivation, and design." IEEE Transactions on device and materials reliability 9, no. 2 (2009): 288-295.

Chen, Yu-Wen, Chuang-Han Hsieh, Kun-Yu Lin, and Kuan-Chi Tsai. "Preventing the cracking of passivation layers on ultra-thick metals." U.S. Pat. No. 8,860,224, issued Oct. 14, 2014. In U.S. Pat. No. 8,860,224, the aspect ratio for distance between metals and the metal height is controlled. If the ratio of the thickness of layers on the metal (T3A) to the height of the metal layer (T1) is smaller than about 0.33, then cracks can be avoided.

Lin, Chi-Fa, Wei-Tsu Tseng, and Min-Shinn Feng. "Advanced IC bonding pad design for preventing stress induced passivation cracking and pad delimitation through stress bumper pattern and dielectric pin-on effect." U.S. Pat. No. 6,165,886, issued Dec. 26, 2000. In U.S. Pat. No. 6,165,886, Y-shaped stress bumpers are used which are hollow stress bumpers that allow passivation layers to grow through them and anchor to dielectric at the bottom. The stress bumpers, which create a discontinuity in the encroached metal pad, can effectively stop the stress propagation as well as relieve and re-direct stress propagation.

SUMMARY

The current disclosure provides a semiconductor device comprising a metal component covered by a passivation layer, and a method of forming a semiconductor device, as set out in the accompanying claims.

Embodiments of the invention will now be described, by way of example only, with reference to the accompanying drawings.

DETAILED DESCRIPTION

Figure 1:
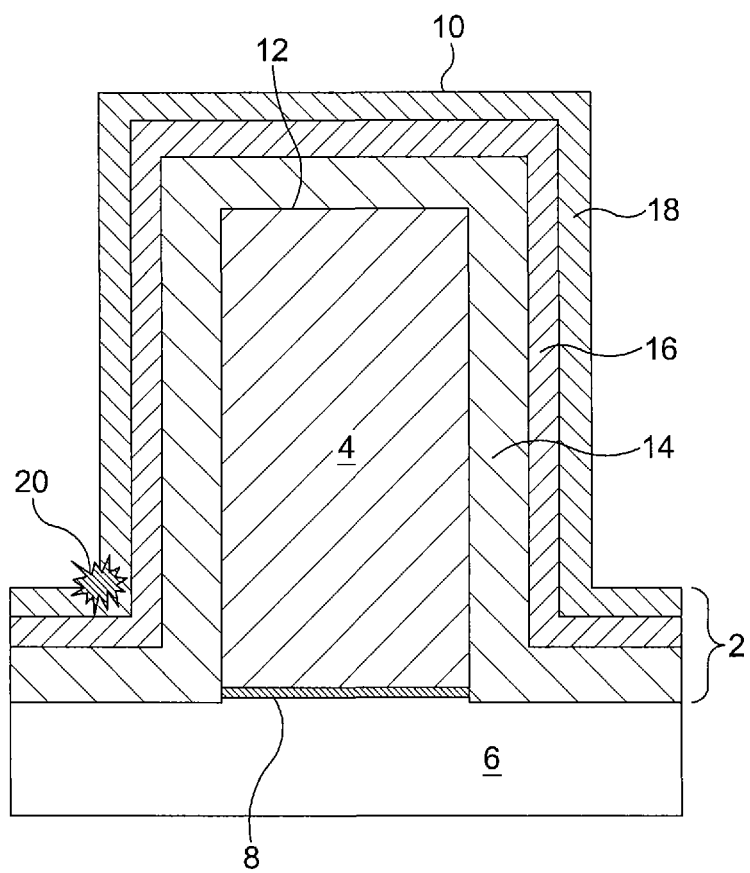
FIG. 1 shows a cross-sectional view of a current passivation scheme.

We first describe the known method illustrated in FIG. 1.

FIG. 1 shows a cross-sectional view of a current passivation scheme for covering a thick metallization scheme.

In the arrangement of FIG. 1 a passivation layer 2 covers a metal layer (metallization) 4. The metal layer 4 is provided on top of an inter metal dielectric layer 6, which is separated from the metal layer 4 by a titanium nitride bottom barrier layer 8.

The passivation layer 2 is conformal, in the sense that it conforms to the shape of the metal layer 4, and effectively forms a coating over the metal layer 4. Thus the shape of the outer surface 10 of the passivation layer 2 is similar to, or essentially the same as, the shape of the outer surface of the metal layer 4.

The passivation layer 2 is comprised of the following three layers, which are fabricated one on top of the other:
1. A High Density Plasma Deposited Silicon Dioxide (HDP $SiO_2$) layer 14; followed by
2. A Silicon Rich Oxide (SRO) layer 16; followed by
3. A Silicon Nitride ($Si_3N_4$) layer 18.

Chemical Mechanical Planarization (CMP) is not involved in the process of forming the passivation layer 2 of FIG. 1.

The current design of FIG. 1 uses a conformal coating of a passivation layer for a very high aspect ratio of metal. The aspect ratio of the metal is determined by dividing the height of the metal by its width.

The mismatch of thermal Coefficients of Thermal Expansion (CTE) of the different materials involved in FIG. 1 can result in cracks in the passivation layer. Cracks manifest immediately after formation of the silicon nitride ($Si_3N_4$)

layer by PECVD. The crack rate increases after Temperature Cycling Tests (TCTs). FIG. 1 shows such a crack 20, formed after temperature cycling.

Figure 2:
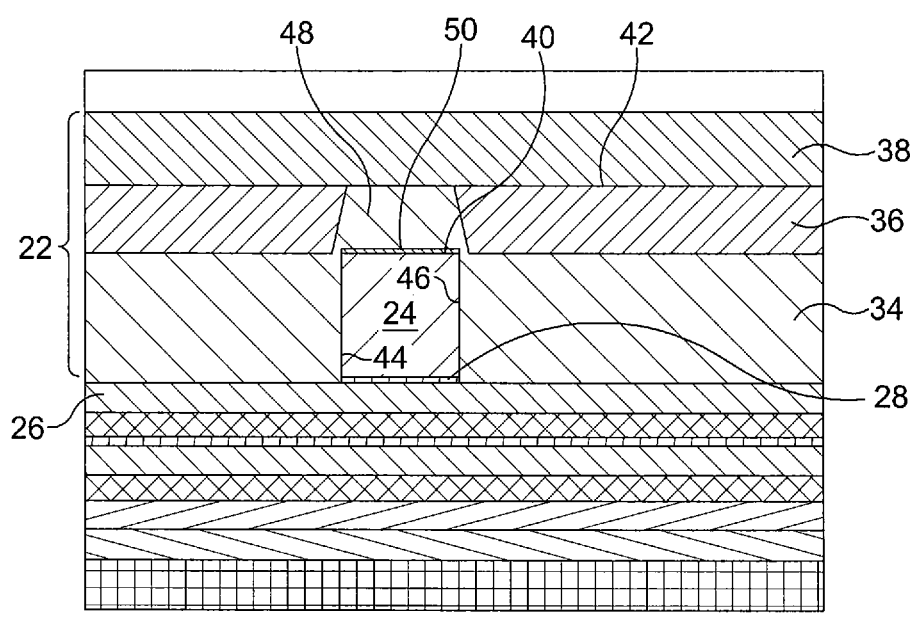
FIG. 2 shows an improved passivation scheme.

FIG. 2 shows a new passivation scheme, which may be referred to as a "Full Flat Passivation scheme".

In the arrangement of FIG. 2 a passivation layer 22 covers a thick top metal layer (metallization) 24. The metal layer 24 is the topmost metal layer, and is provided on top of a dielectric layer 26, which is separated from the metal layer 24 by a titanium nitride (TiN) bottom barrier layer 28. The titanium nitride bottom barrier layer 28 extends only across the width of the metal layer 24, as shown in FIG. 2. In the areas where there is no metal 24, the bottom dielectric layer 26 is in contact with a High Density Plasma Silicon Dioxide (HDP SiO2) layer 34.

In the new design, as seen in FIG. 2, the passivation layer 22 covering the metallization 24 is formed by the following process steps after the metal etch process (which forms the metallization 24):

1. Deposition of a thicker High Density Plasma Silicon Dioxide (HDP SiO$_2$) layer 34, for example using High Density Plasma Chemical Vapor Deposition (HDP CVD);
2. Deposition of a Silicon Rich Oxide (SRO) layer 36;
3. Chemical Mechanical Planarization (CMP) of the HDP Sift and SRO layers 34 and 36;
4. Deposition of a silicon nitride (Si$_3$N$_4$) layer 38 on the planarized surface, for example using PECVD (Plasma Enhanced Chemical Vapor Deposition).

In the design of FIG. 2 the High Density Plasma Silicon Dioxide (HDP SiO$_2$) layer 34 may for example have a thickness of about 3,000 nm, and may for example have a thickness of between 2,900 nm and 3,100 nm.

In the full method of FIG. 2, HDP and SRO deposition is increased to about 3000 nm. The thickness of the Silicon Rich Oxide (SRO) layer 36 may for example be between 100 nm and 200 nm.

CMP of the SRO and HDP layers (34 and 36) causes the top surface to be fully flat. A silicon nitride layer 38 is deposited on the fully flat top surface.

In FIG. 2 a region 48 of the silicon dioxide layer 34 is also present above the metal layer 24, and this region 48 is separated from the metal layer 24 by a titanium nitride top barrier layer 50. The region 48 of silicon dioxide is formed above the metal layer 24 when the silicon dioxide layer 34 is deposited. After deposition of the SRO layer 36, CMP is performed on the SRO layer 36 together with the region 48, and these are planarized so that the upper surface of the SRO layer 36 and the upper surface of the region 48 lie in a single plane. In FIG. 2 the region 48 also therefore divides the SRO layer 36 into two portions after Chemical Mechanical Planarization (CMP) of the SRO layer 36.

From FIG. 2 it can be seen that, unlike FIG. 1, the layers of the passivation layer 22 do not conform to the shape of the metal component 24, and the layers therefore do not simply coat, or follow the shape of, the external surface of the metal component 24. In FIG. 2 it can be seen that each of the SRO and silicon nitride layers 36 and 38 is substantially planar, and that the silicon dioxide layer 34 is substantially planar on either side of said metal component 24. It can also be seen that the silicon nitride layer 38 does not extend below the top surface 40 of the metal component 24, and the SRO layer 36 does not extend substantially below the top surface 40 of the metal component 24, for example the SRO layer 36 does not extend below 75% of the height of the top surface 40 of the metal component 24. It can also be seen that said Silicon Dioxide layer 34 has a top surface 42 which is approximately the same height as said top surface 42 of said metal component 24 in the regions on either side of said metal component 24.

As noted above, in FIG. 2, unlike in FIG. 1, the silicon nitride layer 38 does not extend below the top surface 40 of the metal component 24, and this is the case for a considerable distance on either side of the metal component 24. For example, we can say that the silicon nitride layer 38 does not extend below the top surface 40 of the metal component 24 at least for a distance on either side of the metal component 24, wherein said distance is for example equal to the width of the metal component 24, and said width is the distance between the two sides 44 and 46 of the metal component 24.

As shown in FIG. 2, a titanium nitride (TiN) bottom barrier layer 28 is provided on the bottom surface of the metal layer 24, and a titanium nitride (TiN) top barrier layer 50 is provided on the top surface 40 of the metal layer 24. The top surface 40 of the metal layer 24 (and the bottom surface of the top barrier layer 50) lie in the same plane as the boundary between the silicon dioxide layer 34 and the SRO layer 36. The thicknesses of the barrier layers 28 and 50 in FIG. 2 are not drawn to scale, and these layers are very thin compared to the aluminum metal layer 24, which may have a thickness of about 3,000 nm. For example, the top barrier layer 50 may have a thickness of between 50 nm and 80 nm. The top barrier layer 50 may be formed using Physical Vapor Deposition (PVD), and the method may include depositing the top barrier layer 50 on the metal layer 24 before depositing the silicon dioxide layer 34.

The metal layer 24 has a high Coefficient of Thermal Expansion (CTE) compared to the surrounding dielectrics such as silicon dioxide layer 34, as shown in the table below. The inclusion of the TiN top barrier layer 50, which has an intermediate CTE, acts as a buffer to minimize the resultant stress experienced by the dielectrics. The mismatch in the CTE between the layers is further de-risked by the TiN top barrier layer 50 having a much higher elastic modulus than the other layers, as shown in the table below, which minimizes the effect of volumetric expansion/contraction of metal layer 24 on the silicon dioxide layer 34.

| Material | Elastic Modulus (GPa) | Coefficient of Thermal Expansion, um/(mK) |
|---|---|---|
| HDP SiO2 | 70.8 | 0.56 |
| TiN | 251.0 | 9.40 |
| Al | 70.0 | 23.10 |
| Cu | 110-128 | 16.50 |

During thermal events such as cooling down of the passivation layer 22 after deposition of layers 34, 36 and 38, as well as temperature cycling, cracks can become manifest on the surface of the silicon nitride layer 38 especially at areas with high Stress Intensity Factors (SIF). The design of FIG. 2 eliminates or reduces the occurrence of cracks compared to the design of FIG. 1.

Slice views of an electromigration test structure (which is typically used to determine the lifetime of a conductor undergoing electromigration) can be used as a representative for the concerned area that underwent cracking. The fully flat passivation method of FIG. 2 shows lower stress intensity as there are no sharp corners. If a crack forms it is unlikely to propagate further.

The present document discloses the fabrication of a fully flat passivation scheme encompassing thick metallization. An object of the method and arrangement described is to eliminate cracking of the passivation layer on top of the thick metallization after fabrication as well as after temperature cycling.

The method may include using High Density Plasma Chemical Vapor Deposition (HDP CVD), Plasma Enhanced Chemical Vapor Deposition (PECVD) and Chemical Mechanical Planarization (CMP)

The fully flat passivation layer 22 encompasses the high aspect ratio thick metallization 24. This prevents high Stress Intensity Factors (SIF) and therefore eliminates cracks occurring due to mismatch in Coefficient of Thermal Expansion (CTE) between the metal and the surrounding layers of the passivation layer 22. As a result, unlike in the prior art described above, circuit designers are not limited by additional design rules that aim to reduce the Stress Intensity Factor.

Accordingly an advantage of the method described is to reduce stress that results in cracking failure within the passivation layer 22 that covers thick metallization 24 due to thermal events such as cooling down of the passivation layers after deposition, as well as temperature cycling. Another advantage of the system and method is the reduction of resultant stress on the passivation layer 22 due to stress induced by high mismatch of the Coefficient of Thermal Expansion (CTE) of the mold compound and the silicon nitride ($Si_3N_4$) layer 38 during electronic package level temperature cycling.

Full FLATPV samples have been subjected to temperature cycling per AECQ-100 standards. In a test which used temperatures of −55 to 150 degrees C., and 2,000 cycles, no passivation cracks were observed on all samples that underwent the Temperature Cycling Test.

The method may be used in Back End of Line (BEOL) top passivation processes.

Each feature disclosed or illustrated in the present specification may be incorporated in the invention, whether alone or in any appropriate combination with any other feature disclosed or illustrated herein.

The invention may be defined by any one of the following numbered clauses:

1. A semiconductor device comprising a metal component covered by a passivation layer, wherein:
   said metal component has a top surface;
   said passivation layer comprises an outer layer which is substantially planar; and
   said outer layer of said passivation layer does not extend below said top surface of said metal component.
2. A semiconductor device according to clause 1, wherein said passivation layer comprises a High Density Plasma Silicon Dioxide (HDP $SiO_2$) layer which is substantially planar in the regions on either side of said metal component.
3. A semiconductor device according to clause 2, wherein:
   said Silicon Dioxide layer has a top surface which is approximately the same height as said top surface of said metal component in the regions on either side of said metal component.
4. A semiconductor device according to clause 2 or 3, wherein:
   said Silicon Dioxide layer has a thickness in the range 2900 nm to 3100 nm.
5. A semiconductor device according to any preceding clause, wherein said passivation layer comprises a substantially planar Silicon Rich Oxide (SRO) layer.
6. A semiconductor device according to clause 5, wherein:
   said SRO layer does not extend below 75% of the height of said top surface of said metal component.
7. A semiconductor device according to clause 5 or 6, wherein:
   said SRO layer has a thickness in the range 100 nm to 200 nm.
8. A semiconductor device according to any preceding clause, wherein said passivation layer comprises a substantially planar silicon nitride ($Si_3N_4$) layer.
9. A semiconductor device according to clause 7, wherein said a silicon nitride ($Si_3N_4$) layer is said outer layer of said passivation layer.
10. A semiconductor device according to any preceding clause, wherein:
    said metal component has at least two side surfaces, and a width defined as the maximum distance between said two side surfaces; and
    said outer layer of said passivation layer does not extent below said top surface of said metal component at least for a distance equal to said width on either side of said metal component.
11. A semiconductor device according to any preceding clause, wherein a titanium nitride (TiN) barrier layer is provided on said top surface of said metal component.
12. A semiconductor device according to clause 11, wherein said titanium nitride barrier layer separates said metal component from a region of silicon dioxide which is located above said metal component.
13. A method of forming a semiconductor device, said method comprising the steps of:
    providing a metal component having a top surface;
    providing a passivation layer over said metal component such that an outer layer of said passivation layer is substantially planar and does not extend below said top surface of said metal component.
14. A method according to clause 11, wherein said step of providing a passivation layer comprises:
    depositing over said metal component a substantially planar High Density Plasma Silicon Dioxide (HDP $SiO_2$) layer.
15. A method according to clause 12, wherein said Silicon Dioxide layer is deposited using High Density Plasma Chemical Vapor Deposition (HDP CVD).
16. A method according to clause 12 or 13, wherein said step of providing a passivation layer further comprises:
    depositing over said High Density Plasma Silicon Dioxide (HDP $SiO_2$) layer a substantially planar Silicon Rich Oxide (SRO) layer.
17. A method according to clause 14, further comprising:
    performing Chemical Mechanical Planarization (CMP) of said Silicon Dioxide and SRO layers to form a planar surface.
18. A method according to clause 14 or 15, wherein said step of providing a passivation layer further comprises:
    depositing over said Silicon Rich Oxide (SRO) layer a substantially planar silicon nitride layer, being said outer layer.
19. A method according to clause 16, wherein said silicon nitride layer is deposited using PECVD (Plasma Enhanced Chemical Vapor Deposition).
20. A method as claimed in any one of clauses 13 to 19, which further comprises forming a titanium nitride (TiN) barrier layer directly on said top surface of said metal component.
21. A method as claimed in any one of clauses 13 to 20, wherein said semiconductor device is a device as claimed in any one of clauses 1 to 12.

What is claimed is:

1. A semiconductor device comprising a metal component covered by a passivation layer, wherein:
   said metal component is part of a metal layer being the topmost metal layer of said semiconductor device and has a top surface, a first side and an opposite second side; and said passivation layer comprises:
   a High Density Plasma Silicon Dioxide (HDP $SiO_2$) layer which is substantially planar in regions on said first and second sides of said metal component, and has a top surface which is at a same height as said top surface of said metal component in said regions;
   a substantially planar Silicon Rich Oxide (SRO) layer located on top of said silicon dioxide layer on said first and second sides of said metal component and separated by said silicon dioxide layer in a region above said metal component, wherein an upper surface of said SRO layer and an upper surface of said silicon dioxide layer in said region above said metal component lie in a single plane; and
an outer layer located on said SRO layer which is substantially planar.

2. A semiconductor device as claimed in claim 1, wherein:
   said Silicon Dioxide layer has a thickness in the range 2900 nm to 3100 nm.

3. A semiconductor device as claimed in claim 1, wherein:
   said SRO layer does not extend below 75% of the height of said top surface of said metal component.

4. A semiconductor device as claimed in claim 1, wherein:
   said SRO layer has a thickness in the range 100 nm to 200 nm.

5. A semiconductor device as claimed claim 1, wherein said passivation layer comprises a substantially planar silicon nitride ($Si_3N_4$) layer.

6. A semiconductor device as claimed in claim 5, wherein said silicon nitride ($Si_3N_4$) layer is said outer layer of said passivation layer.

7. A semiconductor device as claimed in claim 1, wherein:
   said metal component has at least two side surfaces, and a width defined as the maximum distance between said two side surfaces; and
   said outer layer of said passivation layer does not extend below said top surface of said metal component at least for a distance equal to said width on either side of said metal component.

8. A semiconductor device as claimed in claim 1, wherein said outer layer of said passivation layer does not extend below said top surface of said metal component.

9. A semiconductor device as claimed in claim 1, wherein a titanium nitride (TiN) barrier layer is provided on said top surface of said metal component.

10. A semiconductor device as claimed in claim 9, wherein said titanium nitride barrier layer separates said metal component from said region of silicon dioxide which is located above said metal component.

11. A semiconductor device as claimed in claim 1, wherein said metal component is provided on top of a dielectric layer, which is separated from the metal component by a second titanium nitride (TiN) barrier layer.

* * * * *